United States Patent [19]

Nanjoh et al.

[11] Patent Number: 5,017,987
[45] Date of Patent: May 21, 1991

[54] CONTACT TYPE IMAGE SENSOR

[75] Inventors: Takeshi Nanjoh, Sendai; Kenji Yamamoto, Miyagi, both of Japan

[73] Assignees: Ricoh Company, Ltd., Tokyo; Ricoh Research Institute of General Electronics Co., Ltd., Natori, both of Japan

[21] Appl. No.: 410,847

[22] Filed: Sep. 22, 1989

[30] Foreign Application Priority Data

Mar. 22, 1989 [JP] Japan .................. 64-70231

[51] Int. Cl.$^5$ .................. H01L 27/14; H01L 31/00
[52] U.S. Cl. .................. 357/30; 357/29
[58] Field of Search .................. 357/30 L, 30 H, 29, 357/30 R, 23.7

[56] References Cited

U.S. PATENT DOCUMENTS

| | | | |
|---|---|---|---|
| 4,446,364 | 5/1984 | Hayashi et al. | 250/211 |
| 4,862,286 | 8/1989 | Suda et al. | 358/494 |

FOREIGN PATENT DOCUMENTS

| | | | |
|---|---|---|---|
| 61-84860 | 4/1986 | Japan | 357/30 |
| 61-199660 | 9/1986 | Japan | 357/30 |

Primary Examiner—Jerome Jackson, Jr.
Assistant Examiner—Don Monin
Attorney, Agent, or Firm—Oblon, Spivak, McClelland, Maier & Neustadt

[57] ABSTRACT

A contact type image sensor comprising a transparent substrate, a non-transparent stop layer formed on the transparent substrate and having first windows, an insulator layer formed on the stop layer, a first electrode formed on the insulator layer and having second windows located at positions corresponding to positions of the first windows, a row of photoelectric conversion elements formed on the first electrode and having first and second ends, where each of the first window and the second window are provided in correspondence with one of the photoelectric conversion elements, a transparent second electrode formed on the photoelectric conversion elements, and one or a plurality of dummy windows provided at both the first and second ends of the row of photoelectric conversion elements so that each dummy window is constituted by corresponding windows formed in the stop layer and the first electrode.

9 Claims, 2 Drawing Sheets

ROW OF PHOTOELECTRIC CONVERSION ELEMENTS

CONTACT TYPE IMAGE SENSOR

BACKGROUND OF THE INVENTION

The present invention generally relates to contact type image sensors, and more particularly to a contact type image sensor which generates uniform outputs from all of photoelectric conversion elements thereof.

Generally, a contact type image sensor comprises a transparent substrate, a lower stop layer formed on the transparent substrate and having windows, a transparent insulator layer formed on the lower stop layer, a lower electrode formed on the transparent insulator layer and having windows, a photoelectric conversion part formed on the lower electrode, and an upper electrode which connects to a transparent electrode via through holes of the transparent insulator layer. The photoelectric conversion part comprises an amorphous silicon layer, photoelectric conversion elements and the transparent electrode. The lower electrode is not limited to an optically non-transparent conductive thin film having the windows. For example, it is possible to form on the transparent insulator layer another stop layer having the windows and form an optically transparent conductive thin film (lower electrode) on this other stop layer.

In order to obtain uniform outputs from the photoelectric conversion elements and to improve a modulation transfer function (MTF) of the contact type image sensor, there are usually provided a number of windows dependent on the number of photoelectric conversion elements (reading elements). But conventionally, there are problems in that the outputs obtained from the photoelectric conversion elements of such a contact type image sensor are not constant and a signal-to-noise (S/N) ratio of the contact type image sensor is poor.

SUMMARY OF THE INVENTION

Accordingly, it is a general object of the present invention to provide a novel and useful contact type image sensor in which the problems described above are eliminated.

Another and more specific object of the present invention is to provide a contact type image sensor comprising a transparent substrate, a non-transparent stop layer formed on the transparent substrate and having first windows, an insulator layer formed on the stop layer, a first electrode formed on the insulator layer and having second windows located at positions corresponding to positions of the first windows, a row of photoelectric conversion elements formed on the first electrode and having first and second ends, where each of the first window and the second window are provided in correspondence with one of the photoelectric conversion elements, a transparent second electrode formed on the photoelectric conversion elements, and one or a plurality of dummy windows provided at both the first and second ends of the row of photoelectric conversion elements so that each dummy window is constituted by corresponding windows formed in the stop layer and the first electrode. According to the contact type image sensor of the present invention, it is possible to obtain approximately uniform outputs from all of the photoelectric conversion elements regardless of the positions thereof in the row of photoelectric conversion elements. Hence, the S/N ratio of the contact type image sensor is improved compared to that of the conventional contact type image sensor.

Other objects and further features of the present invention will be apparent from the following detailed description when read in conjunction with the accompanying drawings.

DESCRIPTION OF THE PREFERRED EMBODIMENTS

The present invention relates to a contact type image sensor which has a row of photoelectric conversion elements formed on a transparent substrate with a window provided for each photoelectric conversion element and a transparent protecting layer formed on the photoelectric conversion elements. The present invention is characterized by at least one window which is further provided on the outer side on both ends of the row of photoelectric conversion elements.

The present inventors have studied the conventional contact type image sensor. It was found that because one window is provided in correspondence with one photoelectric conversion element, a quantity of light received by those photoelectric conversion elements excluding the photoelectric conversion elements which are located at both ends of the row of photoelectric conversion elements is different from a quantity of light received by the photoelectric conversion elements which are located at both ends of the row of photoelectric conversion elements.

Figure 1:
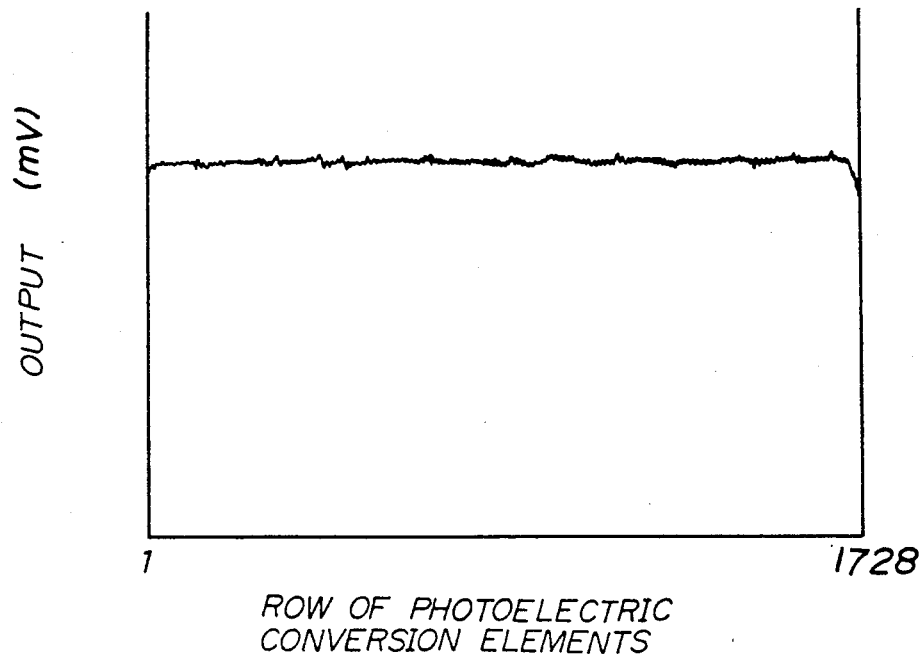
FIG. 1 is a graph showing an output characteristic of a conventional contact type image sensor.

For the sake of convenience, those photoelectric conversion elements excluding the photoelectric conversion elements which are located at both ends of the row of photoelectric conversion elements will be referred to as first photoelectric conversion elements, and the photoelectric conversion elements which are located at both ends of the row of photoelectric conversion elements will be referred to as second photoelectric conversion elements. A light from a light source is irradiated on a document surface through the windows which are formed in correspondence with the first and second photoelectric conversion elements and a reflected light is received by the first and second photoelectric conversion elements. Each first photoelectric conversion element receives the reflected light which is caused by the light which is irradiated on the document surface through the corresponding window and also through the adjacent windows which are located on both sides of the corresponding window. On the other hand, each second photoelectric conversion element receives the reflected light which is caused by the light which is irradiated on the document surface through the corresponding window and also through one adjacent window which is located on one side of the corresponding window. Therefore, the quantity of reflected light received by the second photoelectric conversion element is smaller than the quantity of reflected light received by the first photoelectric conversion element. This difference between the quantity of received light appears as inconsistent outputs of the photoelectric conversion elements of the contact type image sensor as shown in FIG. 1 and results in a poor S/N ratio.

Accordingly, the present invention provides a dummy window on both ends of the row of photoelectric conversion elements so that the windows are provided on both sides of each window which corresponds to one photoelectric conversion element, regardless of whether the photoelectric conversion element is the first or second photoelectric conversion element. The present inventors have confirmed that the provision of the dummy widow makes the quantity of received light approximately constant for each of the first and second photoelectric conversion elements and prevents the deterioration of the S/N ratio.

In the present specification, a "dummy window" refers to an extra window which is not provided in correspondence with a photoelectric conversion element.

Figure 2:
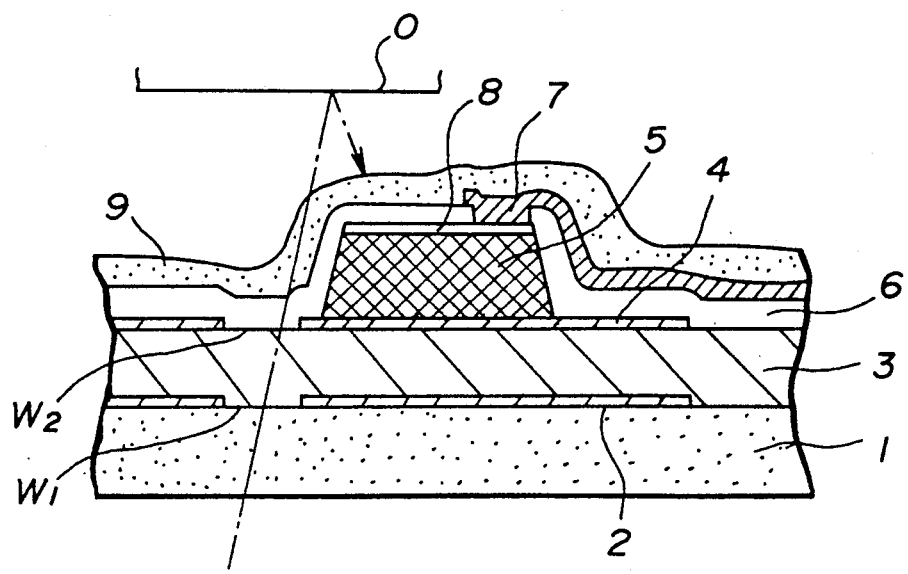
FIG. 2 is a cross sectional view generally showing an essential part of an embodiment of a contact type image sensor according to the present invention.

Next, a description will be given of an embodiment of the contact type image sensor according to the present invention. FIG. 2 generally shows a cross section of an essential part of this embodiment. In FIG. 2, a transparent substrate 1 is made of a glass, pyrex, quartz, insulating polymeric resin or the like. A vapor deposition is made on the transparent substrate by use of a metal such as Cr, Mo, Ti and Co or an alloy thereof, and a lower stop layer 2 and windows W1 are formed simultaneously by a photolithography etching. For example, the windows W1 are formed with an element density of 8 dots/mm.

A transparent insulator layer 3 made of SiO, $SiO_2$, $Si_3N_4$, SiON or the like is formed on the transparent substrate 1 on the side of the lower stop layer 2 by a plasma chemical vapor deposition.

A non-transparent layer which is made of Cr or the like and is optically non-transparent is formed on the transparent insulator layer 3 as a lower electrode 4. Windows W2 are formed in the lower electrode 4 by a method similar to that used for forming the windows W1. It is of course possible to form the lower electrode 4 from an optically transparent material and form a stop layer which has the windows W2 between the lower electrode 4 and the transparent insulator layer 3.

Photoelectric conversion elements 5 are formed on the lower electrode 4. The photoelectric conversion elements 5 are made of an amorphous Si layer, an amorphous SiOH layer, an amorphous SiON layer or the like. A transparent insulator layer 6 which is made of a $SiO_2$, an amorphous SiON or the like is formed between the lower electrode 4 and an upper electrode 7.

A transparent electrode 8 is provided on the photoelectric conversion elements 5. It is advantageous to form this transparent electrode 8 from an ITO.

The upper electrode 7 and the transparent electrode 8 are in contact via through holes provided in the transparent insulator layer 6.

A photoelectric conversion element part is constituted by the lower electrode 4, the photoelectric conversion elements 5, the upper electrode 6 and the transparent electrode 8. The photoelectric conversion element part may have one of the lower electrode 4 and the upper electrode 7 as a common electrode. In FIG. 2, the lower electrode 4 is used as the common electrode and the upper electrode 7 is used as an independent electrode. In FIG. 2, a transparent protecting layer 9 is formed on a top portion of the contact type image sensor, and O denotes a document surface.

Figure 3:
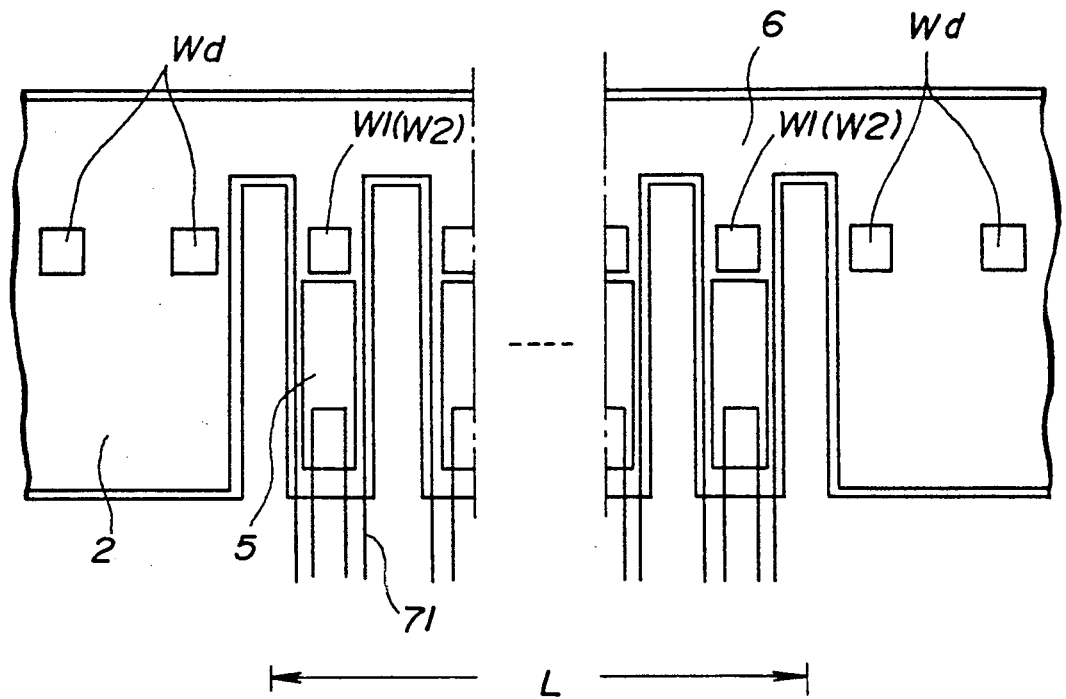
FIG. 3 is a plan view showing an essential part of the embodiment.

FIG. 3 is a plan view of an essential part of this embodiment. In FIG. 3, a row of photoelectric conversion elements is arranged as shown, and the number of photoelectric conversion elements corresponds to a document reading length L. One or a plurality of dummy windows Wd are provided at both ends of the row of photoelectric conversion elements. For example, the size of the dummy window Wd is identical to that of the window W1, and each interval (pitch) between the dummy window Wd and an adjacent window W1 and each interval (pitch) between the dummy window Wd and an adjacent dummy window Wd are all the same. At least one dummy window Wd needs to be provided at both ends of the row of photoelectric conversion elements. Each dummy window Wd is constituted by a window which is formed in the lower stop layer 2 and a corresponding window which is formed in the lower electrode 4. For the sake of convenience, such two corresponding windows will be referred to as the dummy window Wd.

Therefore, each photoelectric conversion element has windows W1 or windows W1 and Wd provided on both sides thereof. Each photoelectric conversion element receives the reflected light which is caused by the light which is irradiated on the document surface O through the corresponding window W1 and also through two adjacent windows W1 or two adjacent windows W1 and Wd which are located on both sides of this corresponding window W1. For this reason, the quantity of reflected light received by the photoelectric conversion element is the same regardless of the location of the photoelectric conversion element in the row of photoelectric conversion elements.

Next, a description will be given of a first case where the number of dummy windows Wd provided at both ends of the row of photoelectric conversion elements is one, two or five, and the size of the dummy window Wd is identical to that of the window W1.

In this first case, a synthetic quartz is used as the transparent substrate 1, and a Cr layer is formed by a vacuum deposition to a thickness of 1000 Å on the transparent substrate 1 as the lower stop layer 2. The Cr layer is patterned by a photolithography etching so as to form the windows W1 and the dummy windows Wd in the lower stop layer 2. An $SiO_2$ layer is then formed by a low-pressure chemical vapor deposition to a thickness of 1 $\mu$m as the transparent insulator layer 3. The $SiO_2$ layer is formed at 800° C. and 0.2 Torr in a gas mixture of $SiH_4$ gas and $N_2O$ gas. A Cr layer is formed by a vacuum deposition to a thickness of 1000 Å on the transparent insulator layer 3, and the lower electrode 4, the windows W2 and the dummy windows Wd are formed by a photolithography etching. The size and pitch of the windows W2 and the windows Wd are the same as those of the windows W1 and the dummy windows Wd which are formed in the lower stop layer 2. In order to form the photoelectric conversion elements 5 on the lower electrode 4, an amorphous silicon layer is formed by a plasma chemical vapor deposition at 300° C. and 1.0 Torr, where the amorphous silicon layer has a p/i/n structure comprising a 500 Å p-type amorphous SiOH, a 5000 Å intrinsic amorphous SiH and a 300 Å n-type amorphous SiH. The photoelectric conversion elements 5 are respectively formed to a size of 110 $\mu$m $\times$ 270 $\mu$m (A$\times$B, where A denotes the width of the photoelectric conversion element along a first direction in which the row of photoelectric conversion elements extends and B denotes the length of the photoelectric conversion element along a second direction perpendicular to the first direction) by carrying out a photolithography etching on the amorphous Si layer.

An ITO layer (or an oxide layer of In or Sn) is formed to a size of 100 μm×250 μm on the amorphous Si layer as the transparent electrode 8. This ITO layer is formed to a thickness of 750 Å by an RF sputtering and a photolithography etching. Furthermore, an amorphous SiON layer is formed to a thickness of 4000 Å by a plasma chemical vapor deposition as the transparent insulator layer 6. This amorphous SiON layer is formed at 300° C. and 0.1 Torr in a gas mixture of $SiH_4$ gas, $CO_2$ gas and $NH_3$ gas. Through holes are formed in the transparent insulator layer 6. An Al layer is formed by an RF sputtering and is patterned by a photolithography etching into the upper electrode 7. The upper electrode 7 makes contact with the already formed transparent electrode 8 via the through holes in the transparent insulator layer 6. An $Si_3N_4$ layer is formed to a thickness of 5 μm by a plasma chemical vapor deposition as the transparent protecting layer 9.

The following first list shows the size and number of the windows W1, W2 and Wd, the pitch of the windows W1 (or W2), the pitch of the windows W1 (or W2) and Wd, and the pitch of the dummy windows Wd.

Size of Windows W1 (or W2): 70 μm × 140 μm
Number of Windows W1 (or W2): 1728
Size of Dummy Windows Wd: 70 μm × 140 μm
Number of Dummy Windows Wd:
 1 at both ends of the row of photoelectric conversion elements; or
 2 at both ends of the row of photoelectric conversion elements; or
 5 at both ends of the row of photoelectric conversion elements
Pitch of Windows W1 (or W2): 125 μm
Pitch of Windows W1 (or W2) and Wd: 125 μm
Pitch of Dummy Windows Wd: 125 μm The following Table 1 shows the output characteristic of this embodiment measured for the cases where the number of dummy windows Wd provided at both ends of the row of photoelectric conversion elements is varied and the output characteristic of the contact type image sensor measured for the case where no dummy window is provided. In Table 1, the output characteristic of the contact type image sensor is measured to know the quantity of received light. In addition, "no. of dummy windows" refers to the number of dummy windows Wd provided at each end of the row of photoelectric conversion elements, "right element" refers to the output of the photoelectric conversion element which is provided at the right end of the row of photoelectric conversion elements, "left element" refers to the output of the photoelectric conversion element which is provided at the left end of the row of photoelectric conversion elements, "intermediate element" refers to the average output of the photoelectric conversion elements which are provided at the intermediate part other than the right and left ends of the row of photoelectric conversion elements, and "PRNU value (value of photo response non uniformity)" refers to a degree of parallelism of the white waveform described by a ratio of maximum and minimum values of the outputs of 1728 photoelectric conversion elements which make up the row of photoelectric conversion elements.

TABLE 1

| No. of Dummy Windows | Right Element | Left Element | Intermediate Element | PRNU Value |
|---|---|---|---|---|
| 0 | 850 mV | 860 mV | 925 mV | 1.094 |
| 1 | 926 mV | 924 mV | 925 mV | 1.006 |
| 2 | 927 mV | 925 mV | 926 mV | 1.007 |
| 5 | 925 mV | 928 mV | 925 mV | 1.007 |

It is seen from Table 1 that the outputs of the photoelectric conversion elements provided at both ends of the row of photoelectric conversion elements are improved by the provision of one or more dummy windows Wd at each end of the row of photoelectric conversion elements. In other words, the outputs of the photoelectric conversion elements become approximately the same regardless of the position thereof in the row of photoelectric conversion elements and the PRNU value is improved.

Next, a description will be given of a second case where one dummy window Wd is provided at each end of the row of photoelectric conversion elements, and the size of the dummy window Wd is set equal to, two times or one-half the size of the window W1 (or W2). The layer structure of the contact type image sensor is the same as that described heretofore, and the size and pitch of the windows W1 and W2 are the same as those given in the first list.

The following second list shows the size and number of the windows W1, W2 and Wd, the pitch of the windows W1 (or W2), and the pitch of the windows W1 (or W2) and Wd.

Size of Windows W1 (or W2): 70 μm × 140 μm
Number of Windows W1 (or W2): 1728
Size of Dummy Windows Wd:
 70 μm × 140 μm (same as windows W1)
 140 μm × 280 μm (2 times windows W1)
 35 μm × 70 μm (½ times windows W1)
Number of Dummy Windows Wd:
 1 at both ends of the row of photoelectric conversion elements
Pitch of Windows W1 (or W2): 125 μm
Pitch of Windows W1 (or W2) and Wd:
 125 μm (size of Wd same as that of W1)
 160 μm (size of Wd 2 times that of W1)
 107.5 μm (size of Wd ½ that of W1)

The following Table 2 shows the output characteristic of this embodiment measured for the cases where the size of the dummy windows Wd provided at both ends of the row of photoelectric conversion elements is varied. In Table 2, the output characteristic of the contact type image sensor is measured to know the quantity of received light. The same designations as used as in Table 1. "Size of Dummy Windows" refers to the size of the dummy window Wd when compared with the size of the window W1 (or W2), and "PRNU value" refers to the degree of parallelism of the white waveform described by the ratio of the maximum and minimum values of the outputs of 1728 photoelectric conversion elements which make up the row of photoelectric conversion elements.

TABLE 2

| Size of Dummy Windows | Right Element | Left Element | Intermediate Element | PRNU Value |
|---|---|---|---|---|
| Same | 926 mV | 924 mV | 925 mV | 1.006 |
| 2 Times | 935 mV | 932 mV | 927 mV | 1.011 |
| ½ Times | 878 mV | 885 mV | 925 mV | 1.059 |

It is seen from Table 2 that the outputs of the photoelectric conversion elements provided at both ends of the row of photoelectric conversion elements are improved by the provision of the dummy window Wd which has a size identical to the windows W1 (or W2) at each end of the row of photoelectric conversion elements. In other words, the outputs of the photoelectric conversion elements become approximately the same regardless of the position thereof in the row of photoelectric conversion elements and the PRNU value is improved. On the other hand, when the size of the dummy window Wd is larger than that of the windows W1 (or W2), the quantity of light received by the photoelectric conversion element provided at the end of the row of photoelectric conversion elements becomes larger than that received by the photoelectric conversion element provided at a position other than the two ends of the row of photoelectric conversion elements, and the PRNU value deteriorates. When the size of the dummy window Wd is smaller than that of the windows W1 (or W2), the quantity of light received by the photoelectric conversion element provided at the end of the row of photoelectric conversion elements becomes smaller than that received by the photoelectric conversion element provided at a position other than the two ends of the row of photoelectric conversion elements, and the PRNU value also deteriorates.

Next, a description will be given of a third case where one dummy window Wd is provided at each end of the row of photoelectric conversion elements, the size of the dummy window Wd is set equal to the size of the window W1 (or W2), and the pitch of the window W1 (or W2) and the dummy window Wd is set equal to, two times or 3/5 times the pitch of the windows W1 (or W2). The layer structure of the contact type image sensor is the same as that described heretofore, the size and number of the windows W1 and W2, the size and number of the dummy windows Wd, and the pitch of the windows W1 (or W2) are the same as those given in the first list.

The following third list shows the size and number of the windows W1, W2 and Wd, the pitch of the windows W1 (or W2), and the pitch of the windows W1 (or W2) and Wd.

Size of Windows W1 (or W2): 70 μm × 140 μm
Number of Windows W1 (or W2): 1728
Size of Dummy Windows Wd: 70 μm × 140 μm
Number of Dummy Windows Wd:
  1 at both ends of the row of photoelectric conversion elements
Pitch of Windows W1 (or W2): 125 μm
Pitch of Windows W1 (or W2) and Wd:
  125 μm (same as that of W1)
  250 μm (2 times that of W1)
  75 μm (3/5 times that of W1)

The following Table 3 shows the output characteristic of this embodiment measured for the cases where the pitch of the window W1 (or W2) and the dummy window Wd provided at each end of the row of photoelectric conversion elements is varied. In Table 3, the output characteristic of the contact type image sensor is measured to know the quantity of received light. The same designations as used as in Table 1. "Pitch" refers to the pitch of the window W1 (or W2) and the dummy window Wd, and "PRNU value" refers to the degree of parallelism of the white waveform described by the ratio of the maximum and minimum values of the outputs of 1728 photoelectric conversion elements which make up the row of photoelectric conversion elements.

TABLE 3

| Pitch | Right Element | Left Element | Intermediate Element | PRNU Value |
|---|---|---|---|---|
| Same | 926 mV | 924 mV | 925 mV | 1.006 |
| 2 Times | 865 mV | 870 mV | 927 mV | 1.075 |
| 3/5 Times | 938 mV | 945 mV | 925 mV | 1.025 |

It is seen from Table 3 that the outputs of the photoelectric conversion elements provided at both ends of the row of photoelectric conversion elements are improved by the provision of the dummy window Wd at each end of the row of photoelectric conversion elements when the pitch of the window W1 (or W2) and the dummy window Wd is set equal to the pitch of the windows W1 (or W2). In other words, the outputs of the photoelectric conversion elements become approximately the same regardless of the position thereof in the row of photoelectric conversion elements and the PRNU value is improved. On the other hand, when the pitch of the windows W1 (or W2) and Wd is larger than that of the windows W1 (or W2), the quantity of light received by the photoelectric conversion element provided at the end of the row of photoelectric conversion elements becomes smaller than that received by the photoelectric conversion element provided at a position other than the two ends of the row of photoelectric conversion elements, and the PRNU value deteriorates. When the pitch of the windows W1 (or W2) and Wd is smaller than that of the windows W1 (or W2), the quantity of light received by the photoelectric conversion element provided at the end of the row of photoelectric conversion elements becomes larger than that received by the photoelectric conversion element provided at a position other than the two ends of the row of photoelectric conversion elements, and the PRNU value also deteriorates.

Figure 4:
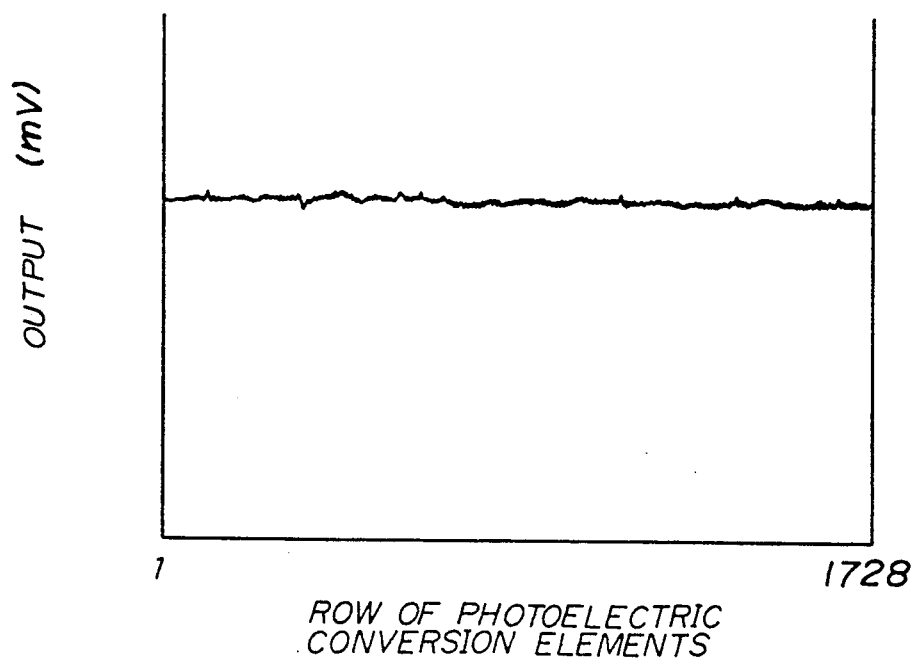
FIG. 4 is a graph showing an output characteristic of the embodiment for a case where a dummy window is provided on both ends of a photoelectric conversion element.

FIG. 4 shows the output characteristic of the embodiment for the first case where one dummy window Wd is provided at each end of the row of photoelectric conversion elements. This case corresponds to a best mode of the invention. In FIG. 4, the ordinate indicates the outputs of the row of 1728 photoelectric conversion elements and the abscissa indicates the position of the photoelectric conversion elements corresponding to the document size.

Further, the present invention is not limited to these embodiments, but various variations and modifications may be made without departing from the scope of the present invention.

What is claimed is:

1. A contact type image sensor comprising:
   a transparent substrate;
   a non-transparent stop layer formed on said transparent substrate and having first windows;
   an insulator layer formed on said stop layer;
   a first electrode formed on said insulator layer and having second windows located at positions corresponding to positions of said first windows;
   a row of photoelectric conversion elements formed on said first electrode, said row of photoelectric conversion elements starting from a first end and ending at a second end, each of said first window and said second window being provided in correspondence with one of said photoelectric conversion elements so that a number of said first windows are respectively equal to a number of photoelectric conversion elements in said row of photoelectric conversion elements;

a transparent second electrode formed on said photoelectric conversion elements; and at least one dummy window which does not correspond with one of said photoelectric conversion elements is provided at each of the first and second ends of said row of photoelectric conversion elements, each of said at least one dummy window including a first window section formed in said stop layer and a corresponding second window section formed in said first electrode.

2. The contact type image sensor as claimed in claim 1 wherein said first and second windows have identical sizes and are provided with identical pitches.

3. The contact type image sensor as claimed in claim 2 wherein said dummy window has a size identical to those of said first and second windows.

4. The contact type image sensor as claimed in claim 3 wherein said dummy windows are provided at each of the first and second ends of said row of photoelectric conversion elements with a pitch identical to those of said first and second windows.

5. The contact type image sensor as claimed in claim 2 wherein said dummy windows are provided at each of the first and second ends of said row of photoelectric conversion elements with a pitch identical to those of said first and second windows.

6. The contact type image sensor as claimed in claim 5 wherein a pitch between said first window and said dummy window is equal to the pitch of said first windows.

7. The contact type image sensor as claimed in claim 2 wherein a pitch between said first window and said dummy window is equal to the pitch of said first windows.

8. The contact type image sensor as claimed in claim 1 wherein said first electrode comprises a non-transparent electrode layer having said second windows.

9. The contact type image sensor as claimed in claim 1 wherein each said first window which is provided in correspondence with a photoelectric conversion element has a said first window and either one of a said first window and a said dummy window arranged on both sides along a direction in which said row of photoelectric conversion elements extends.

* * * * *